United States Patent
Hsu et al.

(10) Patent No.: US 8,435,607 B2
(45) Date of Patent: *May 7, 2013

(54) HOUSING AND METHOD OF MANUFACTURING THE SAME

(75) Inventors: Jen-Hong Hsu, Taipei Hsien (TW); Hai-Lin Chen, Shenzhen (CN); Jian-Wei Zhang, Shenzhen (CN); Yong Yang, Shenzhen (CN); Ying-Hao Feng, Shenzhen (CN); Yu-Guo Zhang, Shenzhen (CN)

(73) Assignees: Fu Zhun Precision Industry (Shen Zhen) Co., Ltd., Shenzhen (CN); Foxconn Technology Co., Ltd., New Taipei (TW)

(*) Notice: Subject to any disclaimer, the term of this patent is extended or adjusted under 35 U.S.C. 154(b) by 678 days.

This patent is subject to a terminal disclaimer.

(21) Appl. No.: 12/534,251

(22) Filed: Aug. 3, 2009

(65) Prior Publication Data

US 2010/0279042 A1 Nov. 4, 2010

(30) Foreign Application Priority Data

May 4, 2009 (CN) .......................... 2009 1 0302094

(51) Int. Cl.
  *B05D 3/06* (2006.01)

(52) U.S. Cl.
  USPC ........ 427/556; 427/555; 427/126.4; 427/409; 427/410; 427/419.5; 216/65; 216/94

(58) Field of Classification Search .................. None
  See application file for complete search history.

(56) References Cited

U.S. PATENT DOCUMENTS

| | | | | |
|---|---|---|---|---|
| 5,409,777 A | * | 4/1995 | Kennedy et al. | 428/411.1 |
| 6,066,437 A | * | 5/2000 | Kosslinger | 430/297 |
| 6,692,895 B2 | * | 2/2004 | Huang et al. | 430/273.1 |
| 6,916,545 B2 | * | 7/2005 | Yano et al. | 428/458 |
| 8,202,592 B2 | * | 6/2012 | Hsu et al. | 428/35.7 |
| 2003/0099782 A1 | * | 5/2003 | Blum et al. | 427/554 |
| 2009/0068404 A1 | * | 3/2009 | Akieda et al. | 428/141 |

* cited by examiner

*Primary Examiner* — Marianne L Padgett
(74) *Attorney, Agent, or Firm* — Altis Law Group, Inc.

(57) ABSTRACT

A housing for a portable electronic device includes a metallic base, a chemical plating layer, a prime layer, a color coating layer, a decorative layer, and a transparent protection layer. The chemical plating layer, the prime layer, the color coating layer, the decorative layer, and the transparent protection layer are coated on the metallic base in that order. The decorative layer defines a pattern extending through the decorative layer.

8 Claims, 2 Drawing Sheets

HOUSING AND METHOD OF MANUFACTURING THE SAME

BACKGROUND

1. Technical Field

The present disclosure generally relates to housings and, particularly, to a housing for a portable electronic device and a method of manufacturing the housing.

2. Description of Related Art

Electronic devices such as notebook computers, MP3 players, personal digital assistants, and mobile phones are in common use. A pleasing appearance and finish, such as a metallic finish, are often important to users.

Accordingly, textured patterns or stripes are often formed on the exterior housing of such devices. Hair lines are commonly formed on metallic housings of materials such as magnesium alloy, aluminum, and stainless steel. However, such metallic housings are difficult to manufacture and at a high cost. Plastic housings are easily manufactured by injection molding and have a low cost, but lack the appeal of the metallic appearance and texturing which can be difficult to directly form on the plastic housing.

Therefore, what is needed, is a housing that overcomes the limitations described.

BRIEF DESCRIPTION OF THE DRAWING

The components in the drawing is not necessarily drawn to scale, the emphasis instead being placed upon clearly illustrating the principles of the present disclosure.

DETAILED DESCRIPTION

Figure 1:
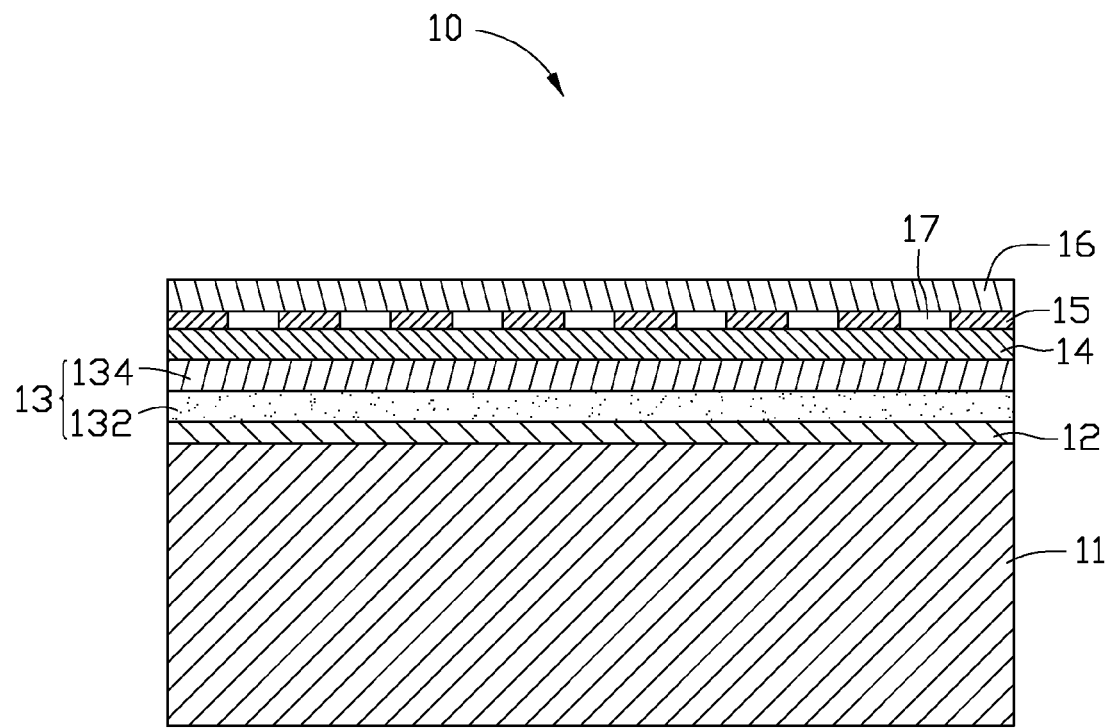
FIG. 1 is a cross-section of a portion of an embodiment of a housing.

Referring to FIG. 1, an embodiment of a housing 10 includes a metallic base 11, a chemical plating layer 12, a primer layer 13, a color coating layer 14, a metallic luster layer 15, and a transparent protection layer 16. The chemical plating layer 12, the primer layer 13, the color coating layer 14, the metallic luster layer 15, and the transparent protection layer 16 are coated on the metallic base 11 in that order. The metallic luster layer 15 defines a pattern 17 extending through the metallic luster layer 15.

The metallic base 11 may be magnesium alloy, aluminum alloy, or any other metal.

The chemical plating layer 12 protects the metallic base 11 from oxidation, and improves coating performance of the metallic base 11. The chemical plating layer 12 may be mainly phosphate.

The primer layer 13 further protects the metallic base 11 from oxidation and corrosion. In the illustrated embodiment, the primer layer 13 includes a first connecting layer 132 adjacent to the chemical plating layer 12, and a second connecting layer 134 coated on the first connecting layer 132.

The first connecting layer 132 masks surface defects of the metallic base 11, and enhances bonding between the chemical plating layer 12 and the second connecting layer 134. The first connecting layer 132 may include polyester resin, epoxy resin, and pigments dispersed therein. The pigments may be carbon black, exhibiting favorable absorption of laser energy. The thickness of the first connecting layer 132 may be about 25 micrometers (μm) to about 50 μm.

The second connecting layer 134 further masks surface defects of the metallic base 11. The second connecting layer 134 may include acrylic resin, polyester resin, epoxy resin, amino resin, acrylate copolymer, propylene glycol methyl ether acetate (PMA), butyl ester, and pigments dispersed therein. The pigments may be carbon black, exhibiting favorable absorption of laser energy. The thickness of the second connecting layer 134 may be about 15 μm to about 20 μm.

The color coating layer 14 normalizes the surface of the metallic base 11 and provides a background color to the pattern 17. The color coating layer 14 may include acrylic resin, polyester resin, epoxy resin, amino resin, acrylate copolymer, PMA, butyl ester, and pigments dispersed therein. The pigments may be any desired color. The thickness of the color coating layer 14 may be about 15 μm to about 80 μm.

The metallic luster layer 15 includes acrylic resin, polyester resin, epoxy resin, amino resin, acrylate copolymer, PMA, butyl ester, pigments and aluminum oxide powder dispersed therein. The pigments and the aluminum oxide powder may be in a nanometer scale. The aluminum oxide powder provides metallic luster to the housing 10, and generates a light reflection effect to provide the pattern 17 with a stereoscopic appearance. The thickness of the metallic luster layer 15 may be about 2 μm to about 7 μm.

The pattern 17 is defined in the metallic luster layer 15 via laser engraving. In the illustrated embodiment, the pattern 17 extends through the metallic luster layer 15 to the color coating layer 14. Thus, the pattern 17 shows the color of the color coating layer 14. Alternatively, the pattern 17 may extend through the metallic luster layer 15 and the color coating layer 14 to the prime layer 13. Thus, the pattern 17 may show the color of the connecting layer 132 or the color of the second connecting layer 134.

The transparent protection layer 16 protects the metallic luster layer 15 and the pattern 17 from abrasion, and improves glossiness of the housing 10. The transparent protection layer 16 may include acrylic resin, polyester resin, epoxy resin, amino resin, silicon dioxide, acrylate copolymer, PMA, and butyl ester. Thickness of the transparent protection layer 16 may be about 20 μm to about 80 μm.

Because the pattern 17 extends through the metallic luster layer 15 and shows the color of the color coating layer 14, when viewed from the front, the pattern 17 shows a color different from the metallic luster layer 15, thus the pattern 17 is conspicuously defined in the metallic luster layer 15. At the same time, the metallic luster layer 15 provides metallic luster to the housing 10, and generates a light reflection effect to enable the pattern 17 to exhibit a stereoscopic appearance. When viewed from the side, the pattern 17 may show changed color, due to the light reflection of the metallic luster layer 15 and the light refraction of the transparent protection layer 16.

In alternative embodiments, if the metallic base 11 has minimal surface defects, the connecting layer 132 or the second connecting layer 134 may be omitted.

Figure 2:
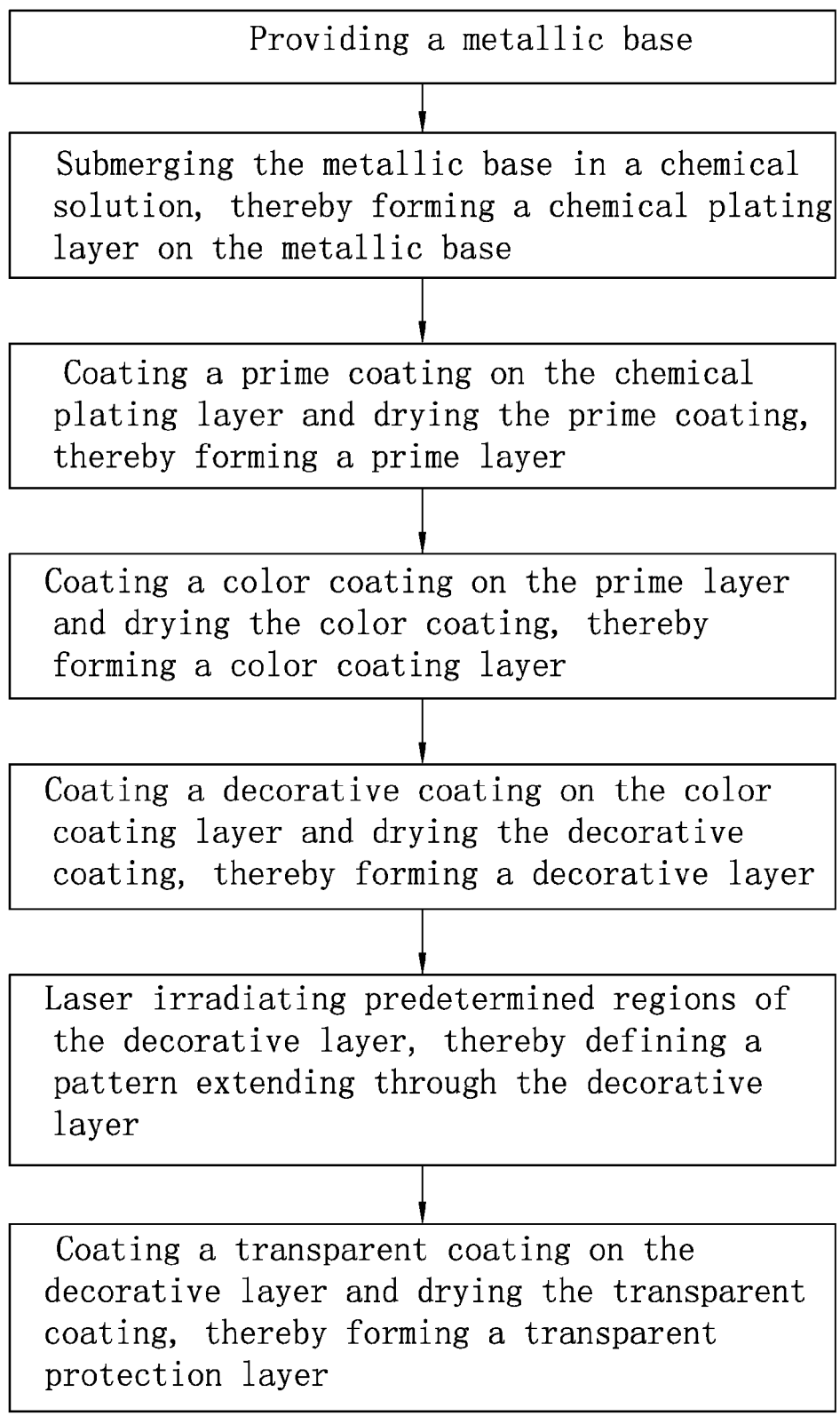
FIG. 2 is a flowchart of an embodiment of a method for manufacturing the housing in FIG. 1.

Referring to FIG. 2, an embodiment of a method of manufacturing the housing 10 is also provided.

The metallic base 11 may be manufactured by casting, forging, or extrusion molding.

The metallic base 11 is submerged in a chemical solution, such as a phosphate solution, forming the chemical plating layer 12 on a surface thereof.

The primer layer 13 is coated on the chemical plating layer 12. The prime layer 13 includes the first connecting layer 132 and the second connecting layer 134. A first connecting coating is coated on the chemical plating layer 12 and dried, thereby forming the first connecting layer 132. A second connecting coating is then coated on the first connecting layer 132 and dried, thereby forming the second connecting layer 134. The first connecting coating may include polyester resin, epoxy resin, and pigments dispersed therein. The first connecting coating may be coated on the chemical plating layer 12 by spray coating. A drying temperature of the first connecting coating is about 150 degrees Celsius (° C.) to about 200° C. A drying time of the first connecting coating is about 10 minutes to about 30 minutes. The second connecting coating may include acrylic resin, polyester resin, epoxy resin, amino resin, acrylate copolymer, PMA, butyl ester, and pigments dispersed therein. The second connecting coating may be coated on the first connecting layer 132 by spray coating. A drying temperature of the second connecting coating is about 130° C. to about 180° C. A drying time of the second connecting coating is about 10 minutes to about 30 minutes.

A color coating is coated on the second connecting layer 134 and dried, thereby forming the color coating layer 14. The color coating may include acrylic resin, polyester resin, epoxy resin, amino resin, acrylate copolymer, PMA, butyl ester, and pigments dispersed therein. The color coating may be coated on the second connecting layer 134 by spray coating. A drying temperature of the color coating is about 50° C. to about 180° C. A drying time of the color coating is about 10 minutes to about 30 minutes.

A metallic luster coating is coated on the color coating layer 14 and dried, thereby forming the metallic luster layer 15. The metallic luster coating may include acrylic resin, polyester resin, epoxy resin, amino resin, acrylate copolymer, PMA, butyl ester, pigments and aluminum oxide powder dispersed therein. The metallic luster coating may be coated on the color coating layer 14 by spray coating. A drying temperature of the metallic luster coating is about 50° C. to about 180° C. A drying time of the metallic luster coating is about 10 minutes to about 30 minutes.

The metallic base 11 is received in a laser engraver, and predetermined regions of the metallic luster layer 15 are engraved. The materials of the metallic luster layer 15 at the predetermined regions disintegrate due to the energy of the laser, thus defining the pattern 17 in the metallic luster layer 15. The power of the laser is adjusted to enable the pattern 17 to extend through the metallic luster layer 15.

A transparent coating is coated on the metallic luster layer 15 and dried, thereby forming the transparent protection layer 16. The transparent coating may include acrylic resin, polyester resin, epoxy resin, amino resin, silicon dioxide, acrylate copolymer, PMA, and butyl ester. The transparent coating may be coated on the metallic luster layer 15 by spray coating. A drying temperature of the transparent coating is about 50° C. to about 180° C. A drying time of the transparent coating is about 10 minutes to about 30 minutes.

Alternatively, the first connecting layer 132 may be omitted, and the second connecting layer 134 directly coated on the chemical plating layer 12, or second connecting layer 134 may be omitted, and the color coating layer 14 directly coated on the first connecting layer 132.

In one embodiment of the method of manufacturing a housing 10, a metallic base 11 is cast of magnesium alloy, and then submerged in a phosphate solution to form a chemical plating layer 12. A first connecting coating is coated on the chemical plating layer 12 and dried for about 30 minutes, at about 150° C., thus forming a first connecting layer 132 about 50 μm thick. A color coating is coated on the connecting layer 132 and dried for about 15 minutes, at about 100° C., thus forming a color coating layer 14 about 15 μm thick. A metallic luster coating is coated on the color coating layer 14 and dried for about 30 minutes, at about 50° C., thus forming the metallic luster layer 15 about 5 μm thick. A laser is irradiated on the predetermined regions of the metallic luster layer 15, thus defining a pattern 17 extending through the metallic luster layer 15. Finally, a transparent coating is coated on the metallic luster layer 15 and dried for about 10 minutes, at about 180° C., thus forming a transparent protection layer 16 about 50 μm thick.

In another embodiment of the method of manufacturing a housing 10, a metallic base 11 is forged of aluminum alloy. The metallic base 11 is then submerged in a phosphate solution to form a chemical plating layer 12. A second connecting coating is coated on the chemical plating layer 12 and dried for about 10 minutes, at about 180° C., thus forming a second connecting layer 134 about 15 μm thick. A color coating is coated on the second connecting layer 134 and dried for about 30 minutes, at about 50° C., thus forming a color coating layer 14 about 80 μm thick. A metallic luster coating is coated on the color coating layer 14 and dried for about 10 minutes, at about 100° C., thus forming a metallic luster layer 15 about 7 μm thick. A laser is irradiated on the predetermined regions of the metallic luster layer 15, thus defining a pattern 17 extending through the metallic luster layer 15. Finally, a transparent coating is coated on the metallic luster layer 15 and dried for about 30 minutes, at about 50° C., thus forming a transparent protection layer 16 about 80 μm thick.

In yet another embodiment of the method of manufacturing a housing 10, a metallic base 11 is cast of magnesium alloy and then submerged in a phosphate solution to form a chemical plating layer 12. A first connecting coating is coated on the chemical plating layer 12 and dried for about 10 minutes, at about 200° C., thus forming a first connecting layer 132 about 25 μm thick. A second connecting coating is coated on the first connecting layer 132 and dried for about 30 minutes, at about 130° C., thus forming a second connecting layer 134 about 20 μm thick. A color coating is coated on the second connecting layer 134 and dried for about 10 minutes, at about 180° C., thus forming a color coating layer 14 about 30 μm thick. A metallic luster coating is coated on the color coating layer 14 and dried for about 15 minutes, at about 180° C., thus forming a metallic luster layer 15 about 2 μm thick. A laser is irradiated on the predetermined regions of the metallic luster layer 15, thus defining a pattern 17 extending through the metallic luster layer 15. Finally, a transparent coating is coated on the metallic luster layer 15 and dried for about 15 minutes, at about 100° C., thus forming a transparent protection layer 16 about 20 μm thick.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A coating method of a housing for a portable electronic device, comprising:
providing a metallic base;
submerging the metallic base in a phosphate solution, thereby forming a chemical plating layer on the metallic base;
coating a primer coating on the chemical plating layer and drying the primer coating, thereby forming a primer layer;
coating a color coating on the primer layer and drying the color coating, thereby forming a color coating layer, wherein the color coating layer comprises acrylic resin, polyester resin, epoxy resin, amino resin, acrylate copolymer, propylene glycol methyl ether acetate, butyl ester, and pigments dispersed therein;

coating a metallic luster coating on the color coating layer and drying the metallic luster coating, thereby forming a metallic luster layer, wherein the metallic luster layer comprises acrylic resin, polyester resin, epoxy resin, amino resin, acrylate copolymer, propylene glycol methyl ether acetate, butyl ester, pigments and aluminum oxide powder dispersed therein;

laser irradiating predetermined regions of the metallic luster layer, thereby defining a pattern extending through the metallic luster layer for exposing the color coating layer; and coating a transparent coating on the metallic luster layer and drying the transparent coating, thereby forming a transparent protection layer on the metallic luster layer for protecting the metallic luster layer from abrasion.

2. The coating method of a housing of claim 1, wherein the prime layer comprises a first connecting layer, and a second connecting layer coated on the first connecting layer; a first connecting coating is coated on the chemical plating layer and dried, thereby forming the first connecting layer; and a second connecting coating is then coated on the first connecting layer and dried, thereby forming the second connecting layer.

3. The coating method of a housing of claim 2, wherein the first connecting layer comprises polyester resin, epoxy resin, and pigments dispersed therein, the second connecting layer comprises acrylic resin, polyester resin, epoxy resin, amino resin, acrylate copolymer, propylene glycol methyl ether acetate, butyl ester, and pigments dispersed therein; a drying temperature of the first connecting coating is about 150° C. to about 200° C., a drying time of the first connecting coating is about 10 minutes to about 30 minutes; a drying temperature of the second connecting coating is about 130° C. to about 180° C., and a drying time of the second connecting coating is about 10 minutes to about 30 minutes.

4. The coating method of a housing of claim 1, wherein a drying temperature of the color coating layer is about 50° C. to about 180° C., and a drying time of the color coating layer is about 10 minutes to about 30 minutes.

5. The coating method of a housing of claim 1, wherein a drying temperature of the metallic luster coating is about 50° C. to about 180° C., and a drying time of the metallic luster coating is about 10 minutes to about 30 minutes.

6. The coating method of a housing of claim 1, wherein the transparent protection layer comprises acrylic resin, polyester resin, epoxy resin, amino resin, silicon dioxide, acrylate copolymer, propylene glycol methyl ether acetate, and butyl ester, a drying temperature of the transparent coating is about 50° C. to about 180° C., and a drying time of the transparent coating is about 10 minutes to about 30 minutes.

7. The coating method of a housing of claim 3, wherein the pigments in the first connecting layer are black carbon.

8. The coating method of a housing of claim 7, wherein the pigments in the second connecting layer are black carbon.

* * * * *